US012771893B2

(12) United States Patent
Hock

(10) Patent No.: US 12,771,893 B2
(45) Date of Patent: Oct. 20, 2026

(54) TRANSPORTATION APPARATUS, HOUSING COMPONENT, AND ASSEMBLY FOR AN ENTERTAINMENT SYSTEM OF A TRANSPORTATION APPARATUS

(71) Applicant: Bayerische Motoren Werke Aktiengesellschaft, Munich (DE)

(72) Inventor: Bertram Hock, Kirchdorf (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 18/726,441

(22) PCT Filed: Nov. 15, 2022

(86) PCT No.: PCT/DE2022/100850

§ 371 (c)(1),
(2) Date: Jul. 3, 2024

(87) PCT Pub. No.: WO2023/131366

PCT Pub. Date: Jul. 13, 2023

(65) Prior Publication Data

US 2025/0080791 A1 Mar. 6, 2025

(30) Foreign Application Priority Data

Jan. 4, 2022 (DE) ..................... 10 2022 100 138.5

(51) Int. Cl.

*H04N 21/414* (2011.01)
*B60R 16/03* (2006.01)
*H05K 7/20* (2006.01)

(52) U.S. Cl.

CPC ... *H04N 21/41422* (2013.01); *H05K 7/20172* (2013.01); *B60R 16/03* (2013.01)

(58) Field of Classification Search

None

See application file for complete search history.

(56) References Cited

U.S. PATENT DOCUMENTS 4,843,477 A 6/1989 Mizutani et al.
2006/0293098 A1 12/2006 Lin (Continued)

FOREIGN PATENT DOCUMENTS

CN 212231477 U 12/2020
CN 113067377 A * 7/2021 .............. H02J 7/731

(Continued)

OTHER PUBLICATIONS

English translation for 113067377 (Year: 2021).*

(Continued)

*Primary Examiner* — Ricky Chin

(74) *Attorney, Agent, or Firm* — Crowell & Moring LLP

(57) ABSTRACT

An assembly for an entertainment system of a transportation apparatus includes a housing with an external connection for supplying the assembly with electric energy, a connection for outputting audio and/or image signals from the assembly, a cavity within the housing for receiving a device of the electronic entertainment system, hereafter referred to as streaming box, and a first video connection which is arranged in the housing of the assembly and which is configured to be connected to a second video connection of the streaming box.

9 Claims, 5 Drawing Sheets

(56) References Cited

U.S. PATENT DOCUMENTS

2008/0130912 A1* 6/2008 Marlowe .............. H04N 21/436 381/86
2009/0303692 A1* 12/2009 Terlizzi ................. G06F 1/1632 361/810
2010/0037072 A1* 2/2010 Nejah ................... G06F 1/1632 342/357.31
2012/0162891 A1* 6/2012 Tranchina .......... H04N 21/2368 361/679.41
2013/0052956 A1* 2/2013 McKell ................... H04M 1/05 361/679.41
2014/0053185 A1* 2/2014 Bleacher .......... H04N 21/41265 725/26
2014/0232930 A1* 8/2014 Anderson .............. H04N 23/69 348/369
2014/0337469 A1* 11/2014 Bang-Olsen ....... H04N 21/6125 709/217
2015/0150061 A1* 5/2015 Bleacher ............ H04N 21/4436 725/76
2015/0244420 A1* 8/2015 Matsudaira .............. H04B 1/10 375/257
2016/0134920 A1* 5/2016 Bleacher .......... H04N 21/41422 725/76
2017/0195708 A1* 7/2017 Morales ........... H04N 21/41422
2018/0020183 A1* 1/2018 Andreev ............ H04N 21/4532
2019/0097669 A1* 3/2019 Zaccaria ................. H04M 1/21
2019/0281340 A1* 9/2019 Sacra ............... H04N 21/41422
2019/0339927 A1* 11/2019 Gosu .................. H04N 21/4828
2021/0084783 A1* 3/2021 Ito ........................ H05K 5/0286
2021/0114531 A1* 4/2021 Choi .................... H01Q 1/3208
2021/0219002 A1* 7/2021 Barnes ............. B64D 11/00155
2023/0065427 A1* 3/2023 Moon ...................... B32B 9/047
2025/0071364 A1* 2/2025 Hock ............... H04N 21/41422
2025/0074136 A1* 3/2025 Hock ................. B60H 1/00271
2025/0080791 A1* 3/2025 Hock ................. H05K 7/20172

FOREIGN PATENT DOCUMENTS

CN 113257289 A * 8/2021 ....... H04N 21/43637
DE 101 00 919 A1 7/2002
DE 10 2006 035 998 A1 2/2008
DE 20 2014 101 016 U1 5/2014
EP 2640081 A2 * 9/2013 ....... H04N 21/41407
EP 2741290 A1 * 6/2014 ............. G11B 19/02
GB 2514393 A * 11/2014 ......... B64D 11/0015
KR 20130028214 A * 3/2013 ....... H04N 21/41422
WO WO 2008/073100 A1 6/2008

OTHER PUBLICATIONS

International Search Report (PCT/ISA/210) issued in PCT Application No. PCT/DE2022/100850 dated Feb. 28, 2023 with English translation (6 pages).

German-language Written Opinion (PCT/ISA/237) issued in PCT Application No. PCT/DE2022/100850 dated Feb. 28, 2023 with English translation (9 pages).

German-language Search Report issued in German Application No. 10 2022 100 138.5 dated Nov. 7, 2022 with partial English translation (11 pages).

* cited by examiner

TRANSPORTATION APPARATUS, HOUSING COMPONENT, AND ASSEMBLY FOR AN ENTERTAINMENT SYSTEM OF A TRANSPORTATION APPARATUS

BACKGROUND AND SUMMARY

The present invention relates to a transportation apparatus, a housing component and an assembly for an entertainment system of a transportation apparatus. In particular, the present invention relates to a flexible and cost-effective option to be able to use current standards of the entertainment industry in transportation apparatuses and to be able to keep the transportation apparatus up-to-date in this respect over its lifespan.

In particular, the present invention relates to an option for automotive-compatible integration of entertainment electronics in the field of video streaming (Google Chrome Cast, Apple TV, Amazon Fire TV (stick)).

In the prior art, vehicle electronics, in particular the multimedia capability of transportation apparatuses, represent an increasingly decisive competitive advantage for vehicle manufacturers. However, the comparatively long development cycles of a new vehicle model can no longer keep pace with the development cycles in the field of entertainment electronics (bandwidths, processor performance, image resolutions, rendering, connectivity, etc.). As a result, the multimedia capabilities of new vehicles are sometimes comparatively old compared to the solutions available for home entertainment. This problem is exacerbated by the longer life cycles of a transportation apparatus compared to devices of the entertainment electronics for the living room at home. In particular, retrofitting the latest hardware and software in transportation apparatuses is usually not economically viable due to distributed and highly integrated hardware. The streaming boxes developed for the living room at home, on the other hand, are neither developed nor suitable for use in transportation apparatuses.

This not only relates to the high temperature change range and any (air) moisture that may penetrate the transportation apparatus, but also to the electrical plug connections and the susceptibility to creaking and rattling or the mechanical connection of the streaming boxes in the transportation apparatus. In addition, crash-technical requirements must be met and heat dissipation of the streaming boxes must be ensured in accordance with the specifications.

It is an object of the present invention to fulfill the need identified above.

In accordance with embodiments of the invention, the aforementioned object is achieved by an assembly for an entertainment system of a transportation apparatus. For example, a car, van, lorry, motorbike, aircraft and/or watercraft can be used as a transportation apparatus. The assembly is now used to present audio and video content within the transportation apparatus. It comprises a housing with an external connection for supplying the assembly with electrical energy. In other words, the housing or its contents are supplied via electrical energy from the on-board power supply of the transportation apparatus in order to be able to output audio and video signals from the assembly to the on-board power supply of the transportation apparatus. A corresponding connection can be built into the housing of the assembly for this purpose. The connection can have a plug connector directed into a cavity within the housing. In other words, an external device of the entertainment electronics, which is referred to as a 'streaming box' in the context of the present disclosure, can be arranged and operated within the cavity in order to entertain the passenger or other occupants. The streaming box can be, for example, a Google Chrome Cast, Apple TV, Amazon Fire TV (stick). Such streaming boxes have their own housing, sometimes also their own power supply unit, a WLAN transceiver, a USB connection, sometimes also an optical audio output and currently in any case an HDMI connection for outputting video signals. In particular, the video connection (HDMI connection) of the streaming box has a corresponding video connection in the assembly according to embodiments of the invention, this video connection is referred to as the 'first video connection' in the context of the present disclosure. A video connection dedicated to the streaming box is referred to as the second video connection in the context of the present disclosure. In particular, the first video connector and the second video connector may have the electrical and mechanical properties known from the corresponding standard for such plug connectors. The first video connector may be provided as a socket within the assembly or as a plug within the assembly. In particular, a socket can be mechanically rigidly embedded in a wall of the housing of the assembly according to the invention. If the first video connection is designed as a cable/plug, this can be arranged flexibly in the cavity of the housing and guided outwards through a wall of the housing. In summary, an assembly is provided with a housing and a cavity within the housing, within which a streaming box can be operated and supplied with electrical energy for this purpose, wherein the assembly has a first video connection (for example in the manner of an HDMI connection) for outputting the video signals of the streaming box. In this way, a flexible update of the transportation apparatus with regard to the multimedia player offered can be made possible by replacing the streaming box with a successor or removing it for the purpose of an update and then using it again.

In order to prevent a plug connection between the first video connection and the second video connection from being inadvertently interrupted, a locking mechanism can be provided in addition to the properties defined by the respective standard, the locking mechanism, for example, creates a positive-locking connection between the first video connection and the second video connection with respect to the plug-in direction as required. In other words, the plug connection can be locked by actuating a latch after the two video connections have been connected, by snapping in a latching lug, by additional clamping of the plug connector housing and/or the cables or similar. This latch can, for example, be pivotably arranged on the housing or on its inner wall. However, this latch can also be arranged on the first video connection, for example. For example, the latch can be provided for clipping onto a plug of the first video connection and/or onto a cable of the first video connection. Alternatively or additionally, the latch can be connected to the second video connection and/or to the streaming box. In particular, an undercut can be created on the first video connection and/or on the second video connection, which makes it more difficult or completely prevents unintentional separation of the two video connections. The latch can also, for example, engage with the retaining element presented later or be connected to it in a positive-locking and/or friction-locking and/or material-bonded manner. This ensures a permanently reliable electrical and/or IT connection between the streaming box and the on-board power supply of the transportation apparatus.

The assembly or the housing can also have a fan which is configured so as to remove air from the housing of the assembly and/or pump air into the housing of the assembly in order to remove the waste heat generated by the streaming box from the housing. Depending on the outside temperature and the operating state of the streaming box, heating or heating of the streaming box can also be provided in order to bring it into a suitable operating range. The fan can, for example, be coupled to a temperature sensor, which is thermally coupled to the streaming box or a retaining element holding the streaming box. In other words, the retaining element can have a sensor unit which, after the retaining element has been mounted on the assembly and on the streaming box, receives signals that allow conclusions to be drawn about the operating and/or temperature status of the streaming box and can be used to control the fan. This ensures that the fan can be operated in a manner as required and unnecessary energy consumption and sources of electromagnetic problems can be (temporarily) avoided.

The connection between the on-board power supply of the transportation apparatus and the streaming box can, for example, have an HDMI and/or a DVI and/or APIX1/APIX2/APIX3 plug connector for connecting the housing to an on-board power supply of the transportation apparatus. In other words, the APIX plug connector (first, second, third or higher generation) can represent the video connection of the assembly (first video connection) or can merge into the same in terms of information technology. In other words, the APIX plug connector can be configured so as to be contacted from outside the assembly (on the on-board power supply side). In addition, a separate electrical connection is preferably provided for receiving electrical energy from the on-board power supply. The assembly can also have a closure, which could also be referred to as a "cover". In particular, the closure can be made of synthetic material in order to allow electromagnetic communication signals, which are wirelessly to be transmitted from the streaming box or received by the streaming box, to pass through essentially unhindered. In particular, the closure can be designed to be attached to the housing by screws and to (partially) close it in the process. In other words, the housing is not just any cavity of the transportation apparatus, but a volume within which the streaming box is housed and operated and which can only be accessed in the event of maintenance, in particular by specialized personnel. Alternatively or additionally, the closure can also be designed to be adhere, clamped or clipped to the housing of the assembly and, in particular, only opened using special tools. In this way, the streaming box can be prevented from being improperly removed or stolen.

Since the shape factor, dimensions, masses and attaching options of the streaming boxes vary across the different versions and manufacturers, this circumstance must be taken into account by the assembly according to embodiments of the invention when it comes to mechanically fixing the streaming box in the housing. For this purpose, a retaining element or a plurality of retaining elements can be provided, which is configured so as to accept a plurality of different configurations in the housing. The different configurations can be provided in the housing, for example, which render possible an in particular reversible connection of the retaining element to the inner wall of the housing. Depending on the size and/or shape of the housing of the streaming box, a mechanical fixation within the cavity of the assembly according to embodiments of the invention can thus be achieved by the retaining element. For example, the retaining element can be screwed to different screw bosses or threads in the housing wall, inserted into different slots, in particular slots arranged equidistantly to one another, and/or connected to a plurality of different retaining lugs. In particular, positive locking areas provided on the retaining element correspond to positive-locking areas provided in the housing of the assembly. In particular, the retaining element can be designed to be elastic in order to ensure that the streaming box is always suitably pre-stressed against the housing wall. In particular, the retaining element can have a soft, rubberized and/or fluffy surface in order to prevent buzzing, rattling and creaking.

At least one area of the retaining element can be arranged opposite the first video connection of the housing with respect to the streaming box. In other words, when mounted, the streaming box is located between the first video connection and an area of the retaining element. In this way, the streaming box can be prevented from moving away from the first video connection, which is particularly advantageous if the first video connection is plugged into a socket of the streaming box as a second video connection. In this context, the retaining element can assume the function of the above-mentioned latch or locking element and coincide with it. The retaining element can be designed as a cable tie and/or as a rubber band and/or as a metal bracket and/or as a synthetic material element/bracket. This does not exclude the option that a plurality of retaining elements of the same or different materials and designs are contained in the assembly according to embodiments of the invention. In particular, the retaining element can be designed as a component of the above-mentioned closure, so that the streaming box is automatically fixed in the cavity when the closure is attached to the housing. In particular, the retaining element has elastic structures which can be compressed between the closure and the streaming box in order to ensure that the streaming box is always suitably pre-stressed against an opposing wall of the housing.

Preferably, the assembly can also have a power supply unit so that streaming boxes can be operated in the assembly without their own power supply unit, for example. For example, there are streaming boxes that are operated using a conventional 230 V connection and transform a voltage internally. Even if the provision of 230 V in conventionally installed vehicle electrical systems is associated with losses and considerable requirements for the electrical insulation of the 230 V sockets, this can enable an uncomplicated, fast and durable use of such streaming boxes. The accommodation in a housing of the assembly according to embodiments of the invention enables a corresponding converter, for example from 12 V to 85-230 V AC voltage or, as a rule, also DC voltage of 120 V-300 V, which can be advantageous for EMC reasons if the housing has a synthetic material cover. A DC voltage supply is generally possible for practically all devices designed for 230 V AC voltage. The power supply unit can be provided in or on the housing or in or on the assembly and connected to the on-board electronic/electrical system of the transportation apparatus. However, the power supply unit can also provide other voltages, such as 5 V, for example, and have a USB connection for this purpose. This means that streaming boxes, which are supplied with electrical energy via a USB connection, can be quickly and easily inserted into the assembly according to embodiments of the invention and connected in terms of energy to the on-board power supply of the transportation apparatus.

According to a second aspect of the present invention, a housing component for a transportation apparatus is proposed. The housing component can be designed, for example, as a center console, service compartment or the like. It has a housing wall and a cavity in which an assembly according to the first-mentioned aspect of the invention is arranged. In other words, the assembly according to embodiments of the invention is contained in a surrounding structure which conceals, protects and fixes the assembly according to embodiments of the invention in the interior of the transportation apparatus. The housing component can comprise an interior surface of the transportation apparatus. For example, it can be arranged on a transmission tunnel, in a dashboard, in a center console, in an armrest or similar. In this way, cables and mechanical assembly elements to lead off from the assembly according to embodiments of the invention can be visually concealed and the assembly according to the invention can be stowed in a crash-proof and visually appealing manner. The features, combinations of features and the resulting advantages of the assembly according to embodiments of the invention obviously correspond to those which have been described in connection with the first-mentioned aspect of the invention in such a manner that reference is made to the above explanations in order to avoid repetition.

According to a third aspect of the present invention, there is proposed a transportation apparatus, for example a car, transporter, motorbike, lorry, aircraft and/or watercraft, which has an assembly according to the first-mentioned aspect of the invention or a housing assembly according to the second-mentioned aspect of the invention. In order to avoid repetition, reference is also made to the above description with regard to the features of the combination of features and advantages of the transportation apparatus according to embodiments of the invention.

Further details, features and advantages of the invention can be seen from the description below and the figures.

DETAILED DESCRIPTION OF THE DRAWINGS

Figure 1:
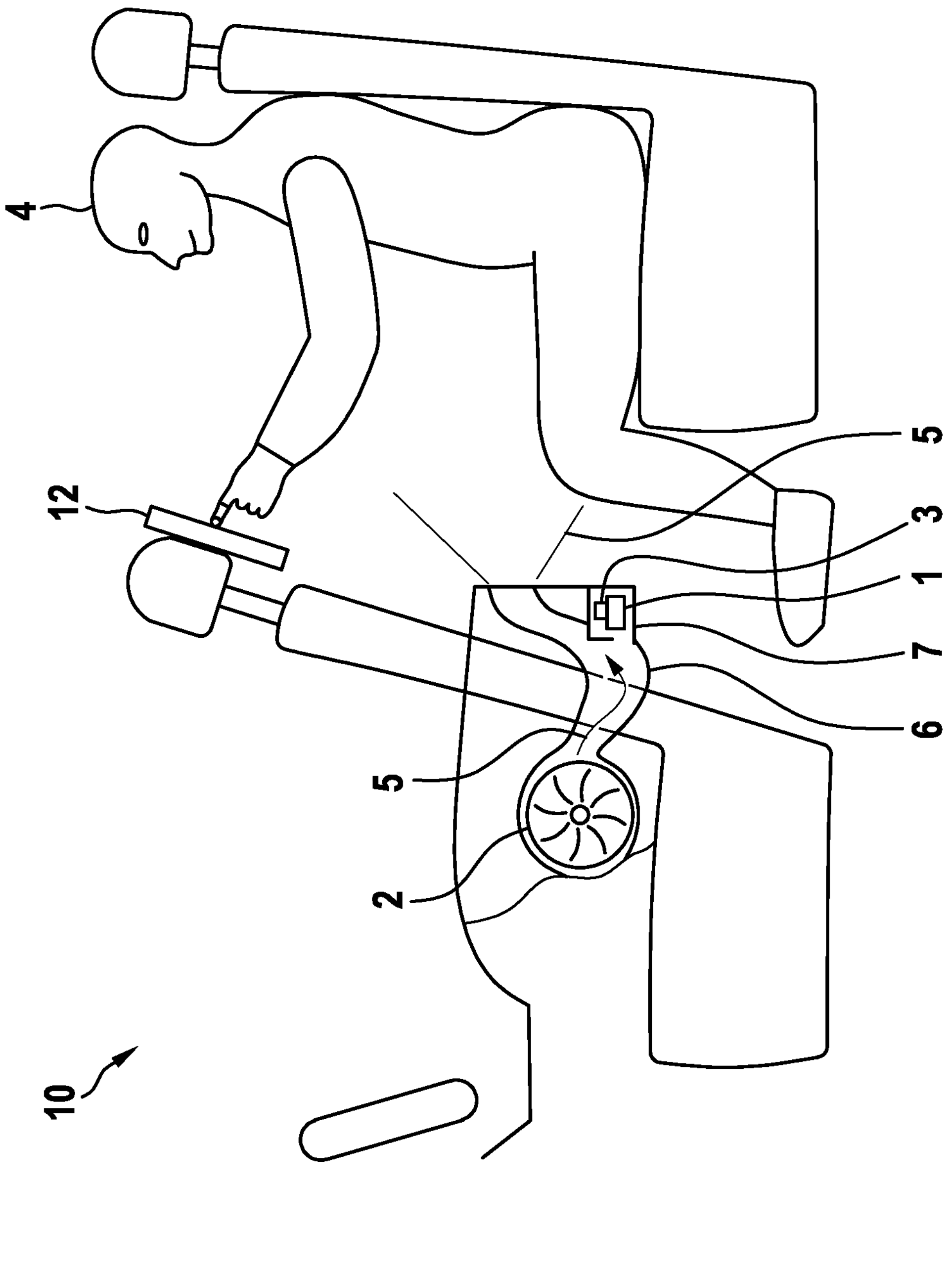
FIG. 1 shows a schematic scene within a transportation apparatus in which an exemplary embodiment of a method according to the invention is carried out.

FIG. 1 shows a user 4 inside a car as a transportation apparatus 10 according to embodiments of the invention, and the user provides inputs via a screen 12 of a rear-seat entertainment system. Via the screen 12, the user 4 can influence the target temperature of a heating/air conditioning system of the car and/or a source selection and/or a playback volume as well as the mode of operation of a streaming box 1. The streaming box 1 is arranged in a housing 7 within a center console of the transportation apparatus 10. The housing 7 is in turn provided with a temperature sensor 3, so that the transportation apparatus 10 receives information about a heat dissipation/heat supply requirement of the streaming box 1. The housing 7 is partially open with respect to an air conditioning duct 6, so that air flow 5 forced by an air pump 2 first flows along the open housing 7 and is then fanned out into the vehicle interior.

Figure 2:
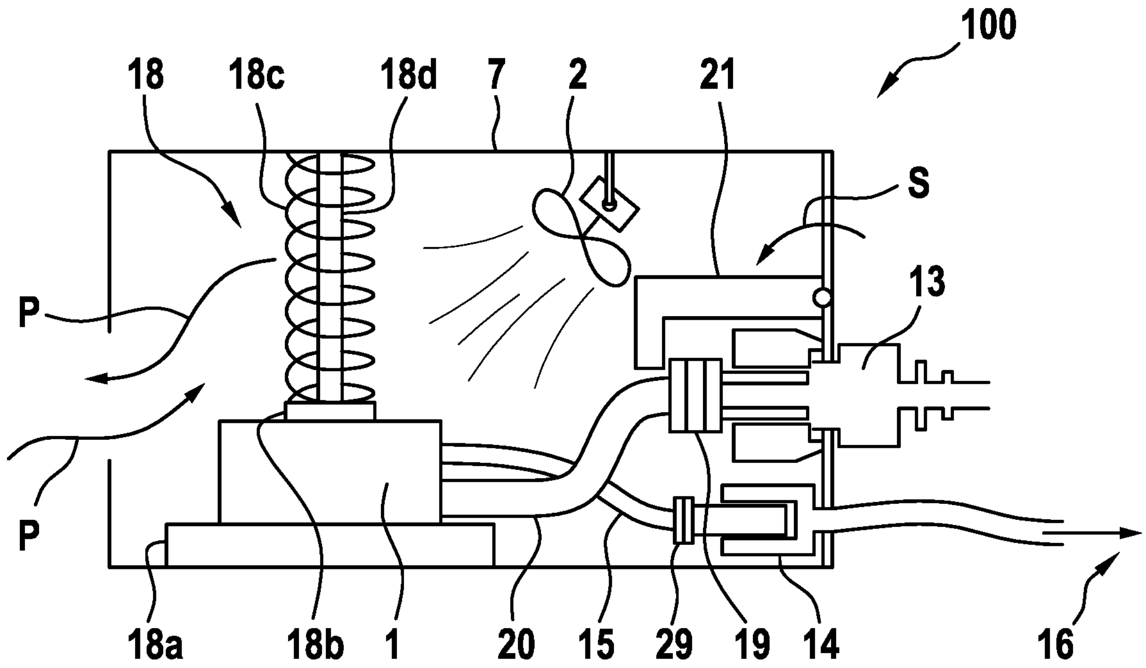
FIG. 2 shows a schematic representation of an exemplary embodiment of an assembly according to the invention.

FIG. 2 shows a schematic representation of an exemplary embodiment of an assembly 100 according to the invention, in which a streaming box 1 is mechanically fixed in a housing 7 by a retaining element 18. The retaining element 18 has an anti-slip element 18*a* and a plunger 18*b*, between which the streaming box 1 is pre-stressed as a result of pre-stressing by way of a spring 18*c* and a guide 18*d*. A fan 2 is configured so as to generate an air flow P for fresh air supply and heat dissipation. The streaming box 1 is connected in terms of energy to a mains connection 13 of the on-board power supply of the transportation apparatus via a cable 20 and a plug 19. A latch 21, which is pivotably mounted on the housing 7 in accordance with an arrow S, is configured so as to secure the positive-locking connection between the mains plug 13 and the plug 19 against unintentional disconnection. A corresponding element is not shown for a cable 15, an HDMI plug 29 and an HDMI socket 14 for the sake of clarity, but could also be used in the same way or correspondingly for the HDMI plug connection (as the first video connection or second video connection). The image signals originating from the streaming box 1 are transmitted to a display unit 16 via the on-board power supply of the transportation apparatus. If the streaming box 1 is to be replaced by a more up-to-date version, the spring 18*c* can be raised, the plug connections between the mains plug 13 and the plug 19 and between the HDMI plug 29 and the HDMI socket 14 can be disconnected, the streaming box 1 can be removed and replaced by a more up-to-date model without having to solder cables together or improvise mechanical fixings for the new component.

Figure 3:
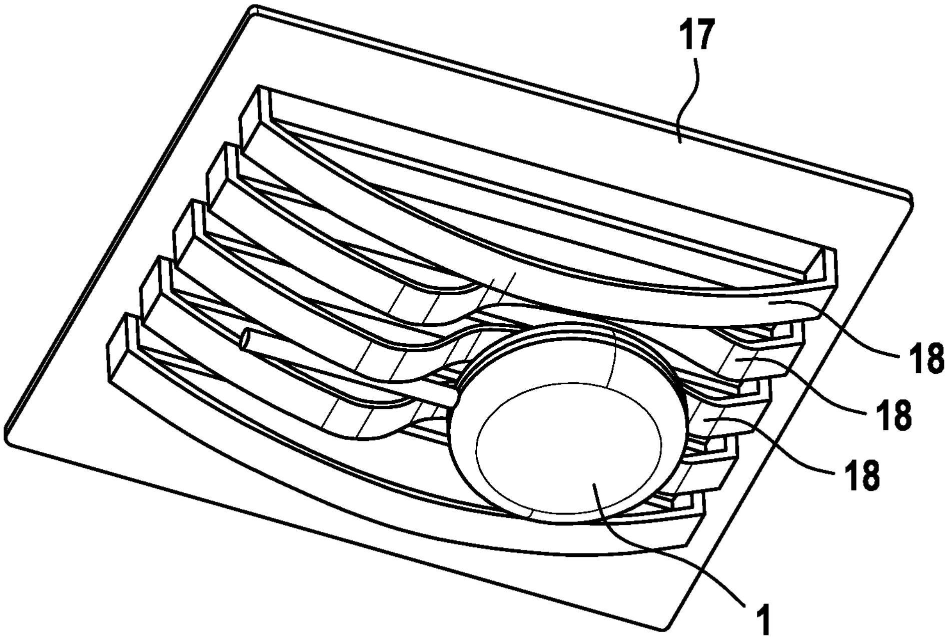
FIG. 3 shows a perspective view of a closure with retaining elements and a streaming box.

FIG. 3 shows a perspective view of a cover as a closure 17, which has convex strip-shaped elastic elements that protrude equidistantly from each other in the direction of a streaming box 1 from a plane of the closure 17. The retaining elements 18 are pushed back by the streaming box 1 at the points where the streaming box 1 is located, thus pre-stressing the streaming box 1 against an opposing housing wall (not shown). Creaking and rattling can thus be effectively and permanently prevented for different streaming boxes 1 with different dimensions and shapes (geometries). In addition, the streaming box 1 is automatically and permanently positioned.

Figure 4:
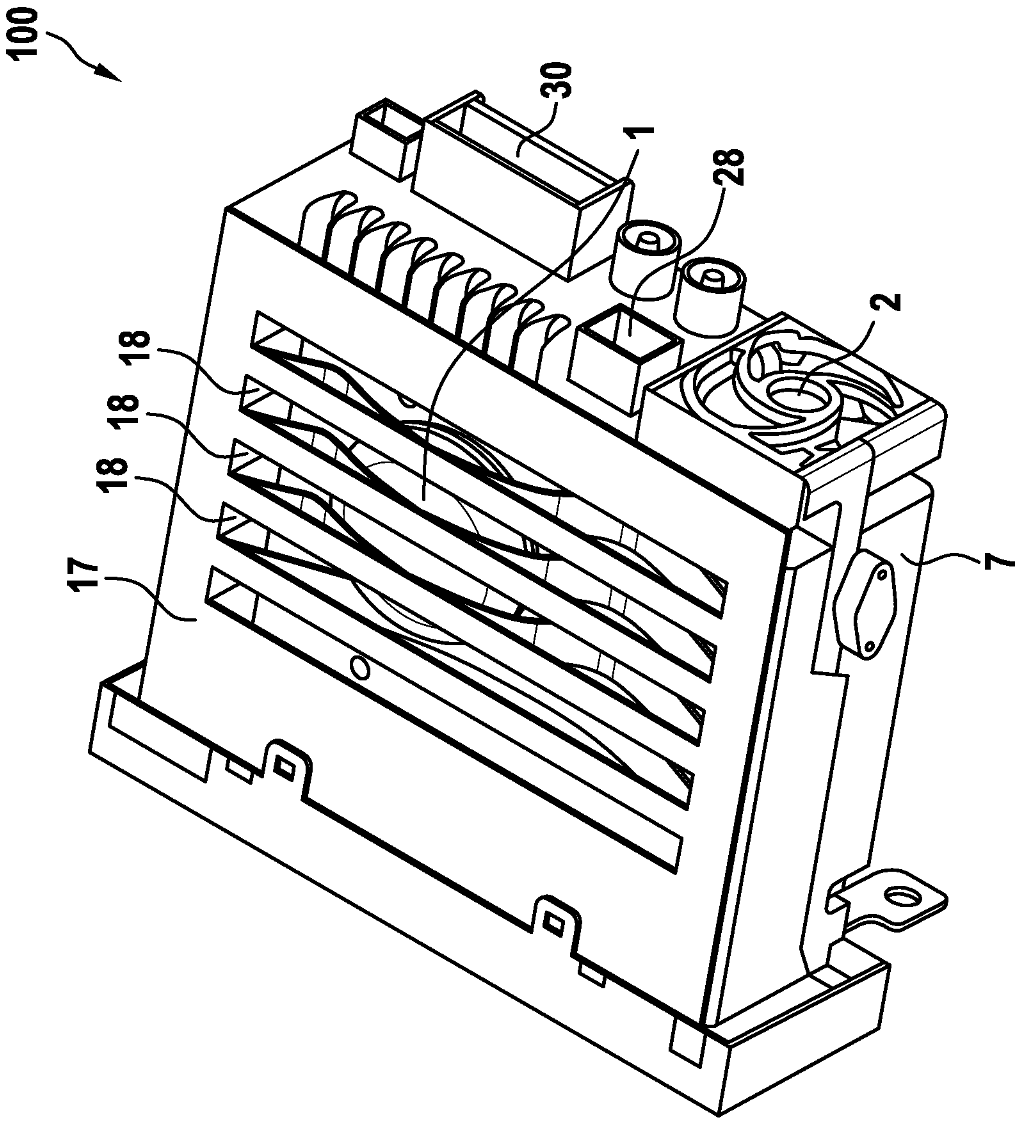
FIG. 4 shows a second exemplary embodiment of an assembly according to the invention with the component shown in FIG. 3.

FIG. 4 shows an assembly 100 on which the closure 17 (see FIG. 3) has been placed. The housing 7 of the assembly 100 is thus closed at the top by the closure. The retaining elements 18 not only hold the streaming box 1, but also ensure comprehensive ventilation of the cavity by exposing strip-shaped recesses or openings in the closure 17. A fan 2 is recessed into the wall of the housing 7. Like the streaming box 1, it is supplied with electrical energy from the on-board power supply of the transportation apparatus via a plug connection 30 and a power supply unit 28.

Figure 5:
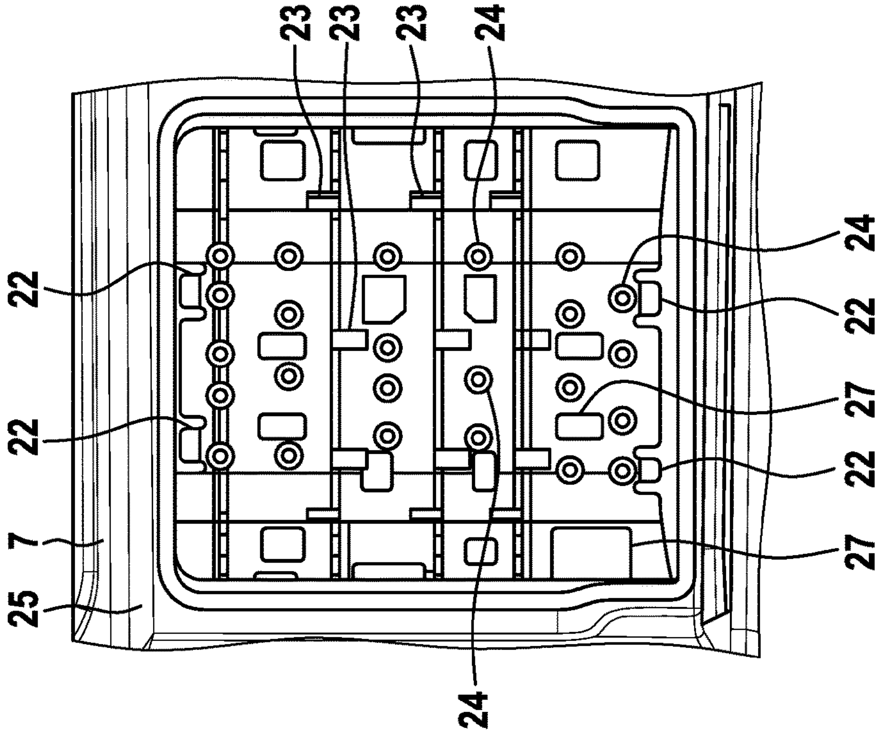
FIG. 5 shows a housing shell of an assembly according to embodiments of the invention that can be used with different embodiments of retaining elements.

FIG. 5 shows a base assembly for an assembly 100, which represents a housing part of the housing 7. Lugs 22, eyelets 23 and screw bosses 24 are provided in the base assembly as retaining structures, which can be used with retaining elements (not shown) to fix the streaming box 1. In particular, rubbers/rubber bands can engage in the lugs 22, cable ties can interact with the eyelets 23 and sheet metal or synthetic material tires can be screwed to the screw bosses 24 when the streaming boxes 1 have been inserted into the illustrated base assembly of the housing component 25.

Figure 6:
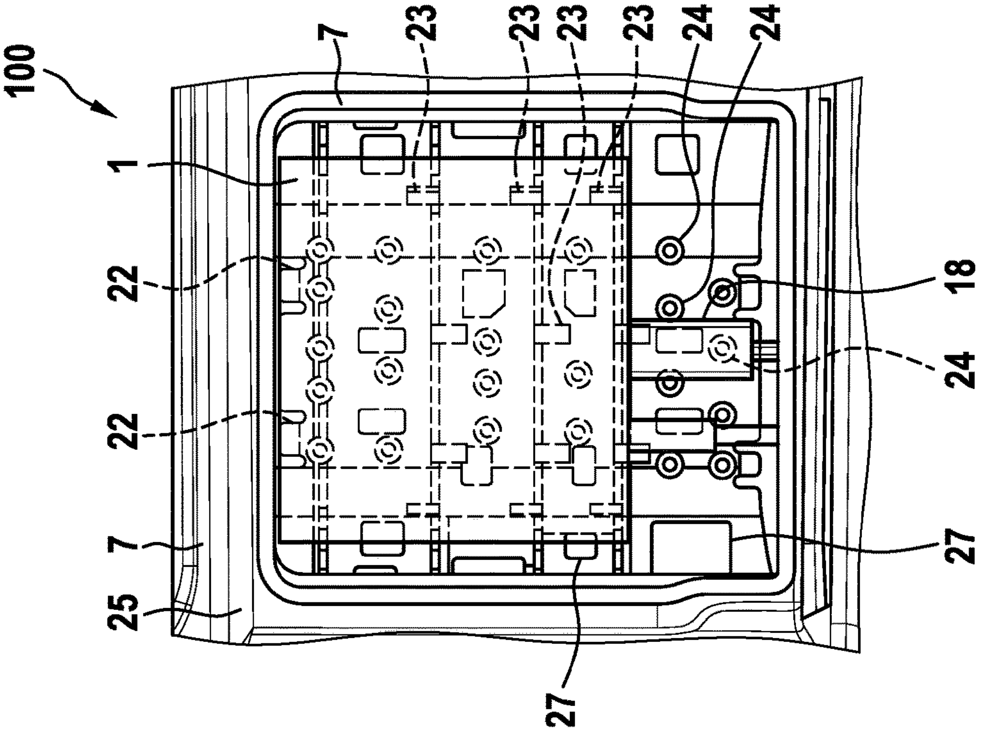
FIG. 6 shows the housing shell shown in FIG. 5 with an inserted streaming box.

FIG. 6 shows the base assembly shown in FIG. 5 with ventilation slots 27 of the housing component 25 after the streaming box 1 has been inserted. The streaming box 1 is clamped to an opposite wall of the housing 7 via a retaining element 18 screwed to a screw boss 24. A first video connection (not shown) can also be arranged here and engaged with a second video connection (not shown) in order to forward the video signals generated by the streaming box 1 to the vehicle electrical system.

Figure 7:
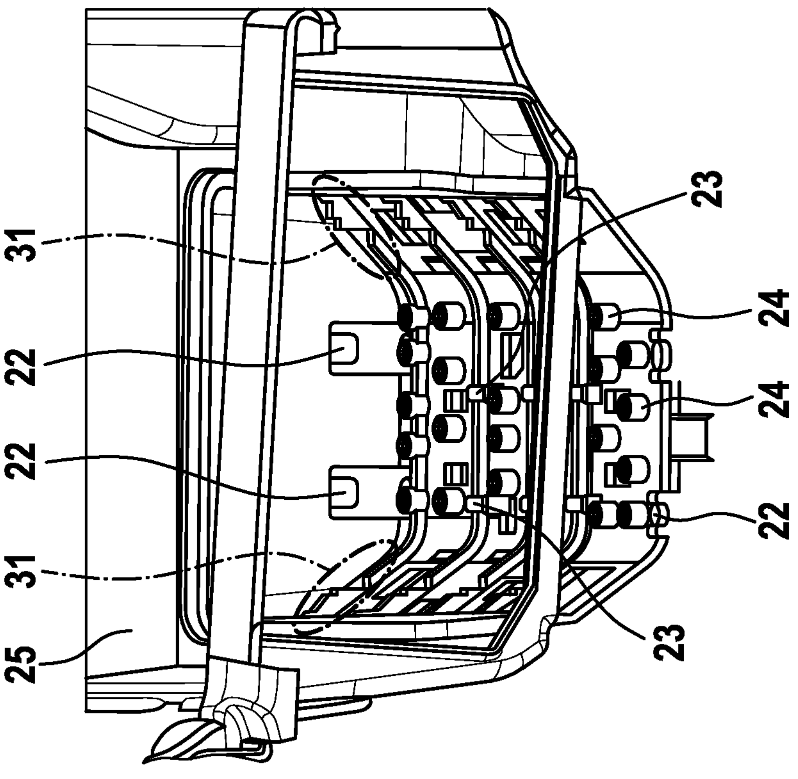
FIG. 7 shows a perspective view of an assembly for manufacturing a housing component according to embodiments of the invention.

FIG. 7 shows an alternative embodiment of a floor assembly of a housing component 25, which has mutually opposing stepped structures 31 in which streaming boxes 1 of different dimensions rest and can be fixed with the structures 22, 23, 24 shown.

Figure 8:
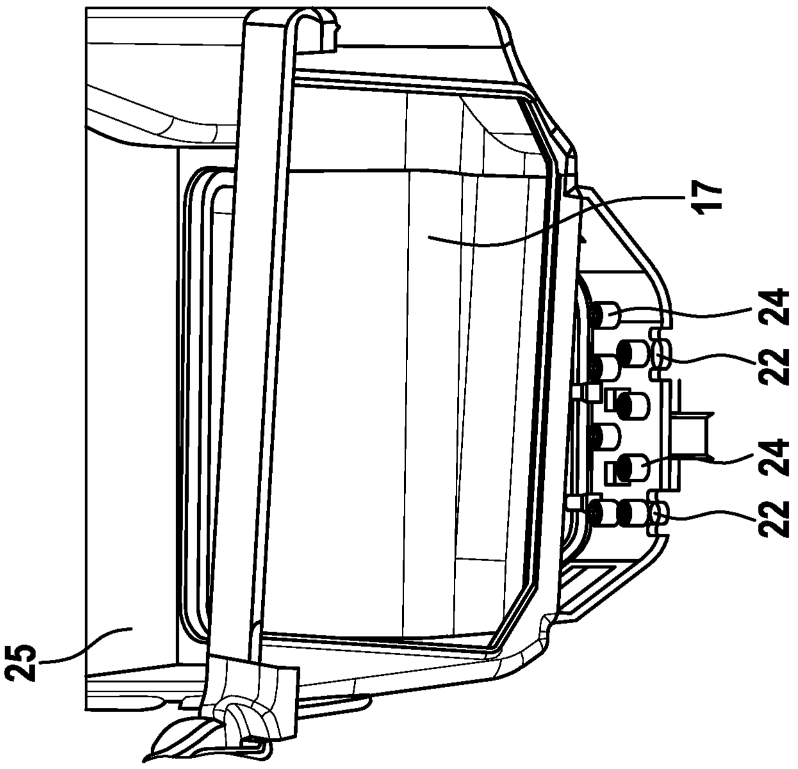
FIG. 8 shows the assembly shown in FIG. 7 after closing with a cover.

FIG. 8 shows the base assembly of a housing component 25 shown in FIG.

7, after a closure 17 closes the housing 7 at the top.

LIST OF REFERENCE SYMBOLS

1 Streaming box
2 Fan
3 Temperature sensor
4 User
5 Air flow
6 Air duct
7 Housing
10 Transportation apparatus
12 Touch screen
13 Power socket
14 HDMI socket
15 Cable
16 Vehicle on-board power supply
17 Closure
18 Retaining element
18*a* Anti-slip mat
18*b* Plunger
18*c* Spring
18*d* Guide
19 Mains plug
20 Cable
21 Latch
22 Lug
23 Eyelet
24 Screw boss
25 Housing component
27 Ventilation slot
28 Power supply unit
29 HDMI plug
30 On-board power supply connection
31 Step structures
100 Assembly

The invention claimed is:

1. An assembly for an entertainment system of a transportation apparatus, the assembly comprising:

a housing with an external connection for supplying the assembly with electrical energy, a cavity within the housing for receiving a streaming box of entertainment electronics, a first video connection which is arranged in the housing of the assembly and configured for connecting to a second video connection of the streaming box, a fan which is configured to remove air from the housing of the assembly, and a retaining element arranged within the cavity, wherein the retaining element is configured to allow a plurality of different configurations and/or positions in the housing, which, depending on a size and/or a shape of the streaming box, render possible a mechanical fixation of the streaming box within the cavity by way of the retaining element, wherein the retaining element comprises an elastic structure in a form of a spring that can be compressed between a cover of the assembly and the streaming box to pre-stress the streaming box against an opposing wall of the housing, and wherein the retaining element is configured to be elastic to cooperate with different structures of the housing which are arranged equidistant from one another.

2. The assembly according to claim 1, further comprising a plug connector for connecting the housing to an on-board power supply of the transportation apparatus.

3. The assembly according to claim 2, wherein the plug connector is an APIX plug connector.

4. The assembly according to claim 1, further comprising a connection which is configured to close the housing by at least one of a positive-locking connection, a sliding guide, or screws.

5. The assembly according to claim 1, wherein the retaining element is arranged opposite the first video connection with respect to the streaming box when the assembly is connected to the first video connection.

6. The assembly according to claim 1, further comprising a power supply unit which is configured to be connected externally to an on-board electrical or electronic system of the transportation apparatus.

7. A housing component for the transportation apparatus, the housing component comprising the cavity in which the assembly according to claim 1 is arranged.

8. The transportation apparatus comprising the assembly according to claim 1.

9. The transportation apparatus comprising the housing component according to claim 7.

* * * * *